United States Patent [19]
Takei

[11] 4,162,506
[45] Jul. 24, 1979

[54] SEMICONDUCTOR INTEGRATED CIRCUIT DEVICE WITH DUAL THICKNESS POLY-SILICON WIRING

[75] Inventor: Sakae Takei, Yokohama, Japan

[73] Assignee: Tokyo Shibaura Electric Co., Ltd., Kanagawa, Japan

[21] Appl. No.: 923,223

[22] Filed: Jul. 10, 1978

Related U.S. Application Data

[63] Continuation of Ser. No. 786,595, Apr. 11, 1977, abandoned.

[30] Foreign Application Priority Data

Apr. 27, 1976 [JP] Japan ................................ 51-47190

[51] Int. Cl.² ............................................ H01L 29/04
[52] U.S. Cl. ...................................... 357/59; 357/23; 357/41; 357/71
[58] Field of Search ...................... 357/73, 41, 59, 71

[56] References Cited

U.S. PATENT DOCUMENTS

| | | | |
|---|---|---|---|
| 3,891,190 | 6/1975 | Vadasz | 357/59 |
| 3,967,981 | 7/1976 | Yamazaki | 357/59 |
| 4,057,824 | 11/1977 | Woods | 357/59 |
| 4,125,854 | 11/1978 | McKenny et al. | 357/59 |

*Primary Examiner*—Joseph E. Clawson, Jr.
*Attorney, Agent, or Firm*—Oblon, Fisher, Spivak, McClelland & Maier

[57] ABSTRACT

A semiconductor integrated circuit device consisting of silicon gate MOS transistors. A polycrystalline silicon wiring layer is formed on a field insulating layer and connected with a polycrystalline gate electrode layer having a smaller thickness than that of the wiring layer, whereby the resistance of the wiring layer is reduced without making the gate electrode layer thick.

3 Claims, 4 Drawing Figures

SEMICONDUCTOR INTEGRATED CIRCUIT DEVICE WITH DUAL THICKNESS POLY-SILICON WIRING

This is a continuation of application Ser. No. 786,595 filed Apr. 11, 1977 now abandoned.

BACKGROUND OF THE INVENTION

1. Field of the Invention

This invention relates to a semiconductor integrated circuit device, and more particularly to a high density integrated circuit device consisting of silicon gate MOS FETs (Metal Oxide Semiconductor Field Effect Transistors).

2. Description of the Prior Art

Semiconductor integrated circuit devices utilizing silicon gate MOS FETs in which the gate electrode is constituted of a conductive polycrystalline silicon layer are well-known. This integrated circuit device has some advantages, as compared with the known aluminium gate MOS integrated circuit device, such as the fact that multi-layer wiring can be easily employed. To manufacture this integrated circuit device, a technique of forming the wiring layer and the functional elements simultaneously known as the direct contact method is used.

In the silicon gate MOS integrated circuit device referred to above, the delay of transmission signals has become an important problem. This signal delay is caused by the high resistance of the wiring interconnecting the MOS transistors. The length of the gate electrode is not important, because its length is very much shorter than that of the interconnecting wiring. To reduce the resistance, that is, to raise the conductivity of the polycrystalline layer, one could diffuse a heavy impurity concentration therein. However, there is a limit to the impurity capacity of the polycrystalline layer, and it is quite impossible to put this idea into practice. It might be thought that one could make the polycrystalline layer thicker. However, in the above-mentioned direct contact method, the gate electrode layer has the same thickness as that of the interconnecting wiring layer so that there results the problem referred to as "side etch phenomenon" at the gate electrode in accordance with the thickness of the gate electrode layer in a manufacturing process as shown in FIG. 1. Generally the forming of a gate electrode layer 10 in the predetermined pattern is made using an etching means, for instance, in a fluorine plasma with the photoresist film 11 as a mask. When this is done, the etching produces a lateral direction etch C (side etch) of which the amount is approximately the same as the etch amount B in the longitudinal direction. Because of this, the dimension of the polycrystalline silicon layer that is formed becomes smaller than the mask dimensions by about twice the film thickness (2B=2C). Furthermore in a manufacturing line, in practice, variations in the polycrystalline layer thickness, variations in the etching rate and the like occur, and therefore the finished dimensions actually vary greatly, which cause variations in the mutual conductance and the threshold voltage characteristics of each MOS transistor. For these reasons, it is desirable to make the gate electrode layer thin. However in the well-known direct contact method, the gate electrode layer and interconnecting wiring layer are formed in a body that, it is impossible to reduce the resistance of the interconnecting wiring and simultaneously minimize the side etch of the gate electrode layer.

SUMMARY OF THE INVENTION

Therefore, one object of this invention is to provide a semiconductor integrated circuit device in which the operating speed is very high.

Another object of this invention is to provide a semiconductor integrated circuit device consisting of silicon gate MOS transistors, in the manufacturing process of which, the side etch at the gate electrode layer is small.

Yet another object of this invention is to provide a semiconductor integrated circuit device consisting of silicon gate MOS transistors, in which the thickness of interconnecting wiring layer is larger than that of the gate electrode layer. According to this invention, a semiconductor integrated circuit device comprises a semiconductor substrate having one conductivity type, source and drain regions formed in the substrate having another conductivity type, an insulating oxide film formed on the substrate bridging the source and drain regions, a gate electrode layer formed by a first polycrystalline silicon film on the insulating oxide film, and an interconnecting wiring layer formed by a second polycrystalline silicon film and connected with the gate electrode layer, in which the second polycrystalline layer is thicker than the first polycrystalline layer.

BRIEF DESCRIPTION OF THE DRAWINGS

A more complete appreciation of the invention and many of the attendant advantages thereof will be readily obtained as the same becomes better understood by reference to the following detailed description when considered in connection with an accompanying drawing, wherein.

DESCRIPTION OF THE PREFERRED EMBODIMENTS

Figure 1:
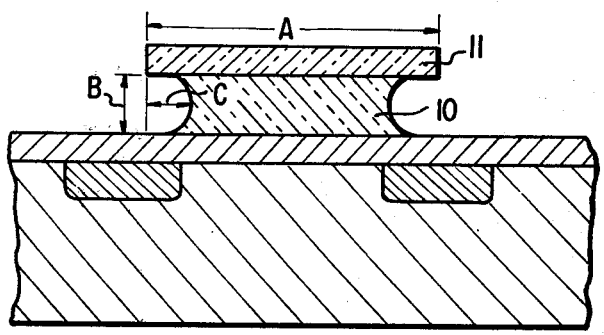
FIG. 1 is a sectional view showing the side etch phenomenon at the gate electrode.
Figure 2:
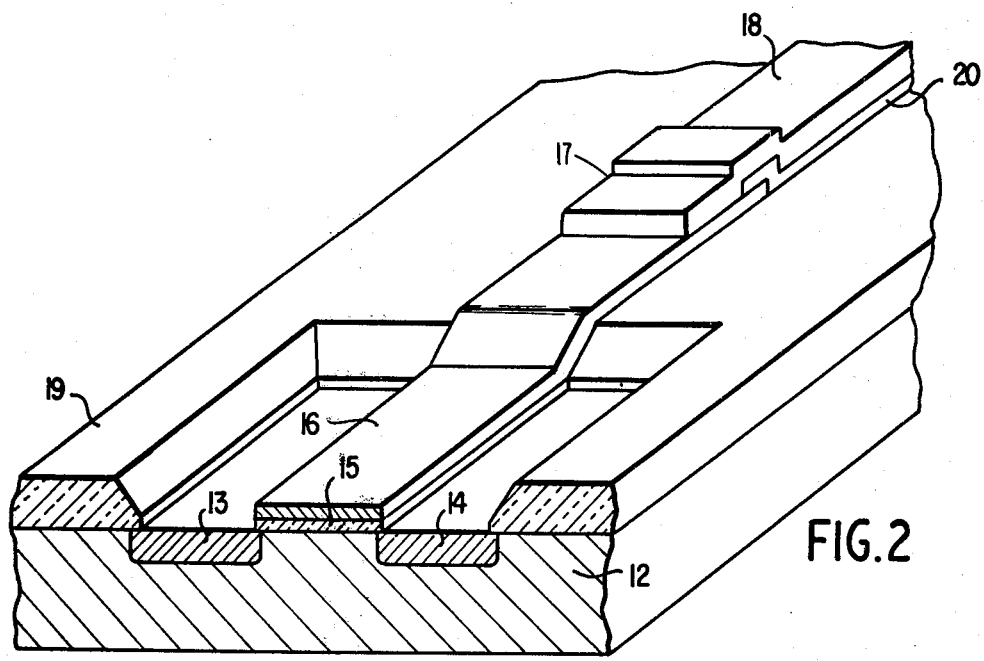
FIG. 2 is a perspective view showing one embodiment of this invention.
Figure 3:
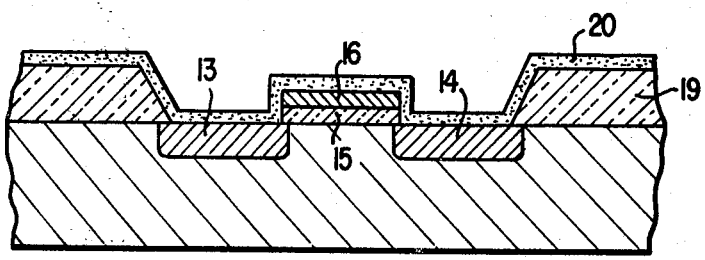
FIGS. 3 and 4 are sectional views showing one embodiment of this invention.
Figure 4:
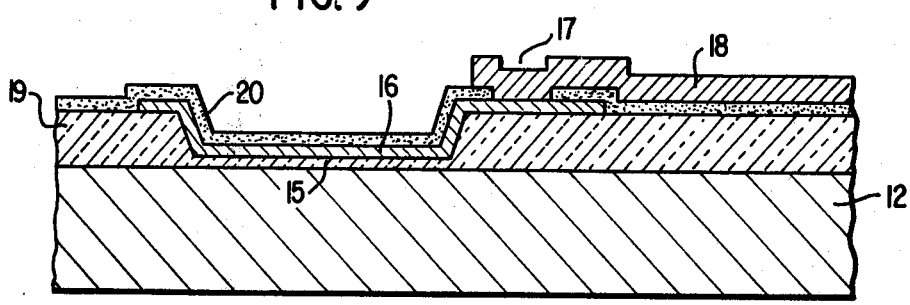

Referring now to the drawings wherein like reference numerals designate identical or corresponding parts throughout the several views and more particularly to FIGS. 2 to 4 thereof, one embodiment of the semiconductor integrated circuit device of this invention is illustrated.

In FIGS. 2 to 4, a gate electrode layer 16 made from a polycrystalline silicon film is formed on a gate insulating layer 15 bridging source and drain regions 13, 14 in a semiconductor substrate 12. The gate electrode layer 16 extends to the contact portion 17, at which an interconnecting wiring layer 18 made from polycrystalline silicon film is connected with the gate electrode layer 16. In accordance with the invention, the interconnecting wiring layer 18 is thicker than the gate electrode layer 16. For instance, in this embodiment, the gate electrode layer 16 is formed with a thickness of $0.2\mu$ and the interconnecting wiring layer 18 is formed with a thickness of $0.3\mu$. When the gate electrode layer has a thickness below about $0.2\mu$, its side etch can be minimized. On the other hand, when the interconnecting wiring layer has a thickness above $0.3\mu$, its resistance is small, so that signal delay can be prevented. Now, as the gate electrode layer and the interconnecting wiring layer are made of the same material, their affinity is good and the connection is made easily.

Next, the method of manufacturing of this integrated circuit device according to this invention will be described.

A thick first silicon oxide film 19 called the field insulating layer, serving to separate the elements from one another, is formed on a semiconductor substrate 12, and in the place where the MOS transistor will be formed the oxide film is removed by the photoetching method. Next, a second silicon oxide film 15 which becomes the gate oxide layer is formed on the substrate and on top of this a first polycrystalline silicon film 16 which becomes the gate electrode is formed. This first polycrystalline silicon film 16 should be made as thin as possible in order to prevent excessive variation of gate length by the side etch phenomenon. For example, in the case where a MOS transistor is made having the gate length of 2μ required for present integrated circuit devices, a tolerance of the gate length, which will present no problems in practice is a value of not more than ±3%. In order to ensure this value, that is to say in order to minimize the side etch, the polycrystalline silicon film thickness must be made not greater than 0.15μ. When the first polycrystalline film 16 is reduced in thickness, the electrical resistance increases, but provided that the first polycrystalline film is used only for the gate electrode, the resistance may be increased by a factor of 2 and 3 without giving rise to any problems. The reason for this is that the length of the gate electrode is made much shorter than the length of the wiring part, and therefore signal delay due to the resistance in this part does not present a problem.

Next, the first polycrystalline silicon film 16 or gate electrode is used as a mask, and the source region 13 and the drain region 14 are formed. Diffusion of the impurity into the first polycrystalline film 16 is of course also effected. Furthermore, a third silicon oxide film 20 is formed over the whole surface of the semiconductor substrate in which each of these elements has been formed. Now by any suitable etching technique the silicon oxide film is removed not only at the contact portion 17 for connecting the gate electrode layer 16 with the interconnecting wiring layer 18, but also in other places, for instance the drain contact part and the source contact part (not shown). Next, a second polycrystalline silicon film 18 having a relatively large film thickness is formed over the whole surface of the substrate and by etching means interconnecting wiring layer and source and drain electrodes are designed with a predetermined pattern. Now, the reason for making the second polycrystalline silicon film 18 thick is that it is necessary to reduce the resistance. The resistance usually depends on the width, the length, the thickness and the impurity quantity of the polycrystalline layer. These are determined by the dimensions and impurity quantity that are most satisfactory as regards the degree of integration. Here, the most satisfactory second polycrystalline film thickness, from the point of present manufacturing technology, is taken to be not less than 0.3μ.

As mentioned above, according to this invention, the interconnecting wiring layer is formed with a larger thickness than that of the gate electrode layer, so that the delay in signal transmission due to wiring resistance can be made small. Furthermore, a semiconductor integrated circuit is provided in which the effect of the side etch at the gate electrodes is very small. Therefore, although the MOS transistor formed in the integrated circuit is miniaturized, it is possible to provide a MOS transistor having the same mutual conductance and threshold voltage characteristics as in the past.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A high-speed semiconductor integrated circuit device comprising:
    a semiconductor substrate of one conductivity type having source and drain regions formed therein of another conductivity type;
    an insulating oxide film formed on the substrate bridging the source and drain regions;
    a gate electrode layer formed by a first polycrystalline silicon film disposed and etched on the insulating oxide film; and
    an interconnecting wiring layer formed by a second polycrystalline silicon film connected with the gate electrode layer, the second polycrystalline silicon film having a thickness greater than the thickness of the first polycrystalline silicon film;
    whereby the resistance of the interconnecting wiring layer is reduced as a result of the greater thickness of the second polycrystalline silicon film made possible by the fact that the gate electrode layer and interconnecting wire layer are not formed in a body, thereby correspondingly increasing the speed of the semiconductor integrated circuit device without increasing the thickness of the gate electrode layer, and therefore without increasing gate electrode layer side etching.

2. The high-speed semiconductor integrated circuit device as in claim 1, wherein:
    the thickness of the first polycrystalline silicon film is less than 0.2μ to minimize side etch and the thickness of the second polycrystalline silicon film is greater than 0.3μ to keep its resistance low.

3. A high-speed semiconductor integrated circuit device comprising:
    a semiconductor substrate of one conductivity type;
    a field oxide insulating layer formed on the substrate, the field oxide insulating layer having apertured portions, source and drain regions of another conductivity type being formed in the substrate at the apertured portions of the field oxide insulating layer;
    an insulating oxide film formed on the substrate bridging the source and drain regions;
    a gate electrode formed by a first polycrystalline silicon film disposed and etched on the insulating oxide film and extending to a contact portion on the field oxide insulating layer; and
    an interconnecting wiring layer formed by a second polycrystalline silicon film connected with the first polycrystalline silicon film at the contact portion, the second polycrystalline silicon film having a thickness greater than the thickness of the first polycrystalline silicon film;
    whereby the resistance of the interconnecting wiring layer is reduced as a result of the greater thickness of the second polycrystalline silicon film, made possible by the fact that the gate electrode layer and interconnecting wire layer are not formed in a body, thereby correspondingly increasing the speed of the semiconductor integrated circuit device without increasing the thickness of the gate electrode, and therefore without increasing gate electrode side etching.

* * * * *